United States Patent
Johnson et al.

(10) Patent No.: US 8,368,208 B2
(45) Date of Patent: Feb. 5, 2013

(54) SEMICONDUCTOR COOLING APPARATUS

(75) Inventors: Scott T. Johnson, Torrance, CA (US); Shadi S. Merhi, Cypress, CA (US)

(73) Assignee: Raytheon Company, Waltham, MA (US)

(*) Notice: Subject to any disclaimer, the term of this patent is extended or adjusted under 35 U.S.C. 154(b) by 84 days.

(21) Appl. No.: 12/896,054

(22) Filed: Oct. 1, 2010

(65) Prior Publication Data

US 2012/0080785 A1  Apr. 5, 2012

(51) Int. Cl.
*H01L 23/34* (2006.01)
*H01L 23/10* (2006.01)

(52) U.S. Cl. ........ 257/719; 257/706; 257/713; 257/717; 257/714; 257/E23.101

(58) Field of Classification Search .................. 257/706, 257/713, 714, 717, 719, E23.101
See application file for complete search history.

(56) References Cited

U.S. PATENT DOCUMENTS

| | | | |
|---|---|---|---|
| 4,747,450 A | 5/1988 | Ikegame et al. | |
| 4,977,444 A | 12/1990 | Nakajima et al. | |
| 5,125,451 A | 6/1992 | Matthews | |
| 5,150,274 A | 9/1992 | Okada et al. | |
| 5,329,419 A | 7/1994 | Umezawa | |
| 5,557,501 A * | 9/1996 | DiStefano et al. | 361/704 |
| 5,706,171 A * | 1/1998 | Edwards et al. | 361/705 |
| 6,111,749 A | 8/2000 | Lamb et al. | |
| 6,212,074 B1 * | 4/2001 | Gonsalves et al. | 361/717 |
| 6,595,270 B2 | 7/2003 | Machiroutu et al. | |
| 6,778,393 B2 * | 8/2004 | Messina et al. | 361/699 |
| 6,867,973 B2 | 3/2005 | Chang | |
| 6,970,355 B2 | 11/2005 | Ellsworth, Jr. et al. | |
| 7,291,913 B2 * | 11/2007 | Edwards | 257/704 |
| 7,515,418 B2 | 4/2009 | Straznicky et al. | |
| 7,547,582 B2 * | 6/2009 | Brunschwiler et al. | 438/123 |
| 7,624,791 B2 | 12/2009 | Strobel et al. | |
| 7,629,684 B2 * | 12/2009 | Alcoe et al. | 257/720 |
| 7,652,884 B2 | 1/2010 | Suzuki et al. | |
| 7,709,951 B2 * | 5/2010 | Brodsky et al. | 257/713 |
| 7,795,724 B2 * | 9/2010 | Brodsky et al. | 257/712 |
| 2003/0001258 A1 * | 1/2003 | Kodama et al. | 257/727 |
| 2006/0261469 A1 * | 11/2006 | Ni et al. | 257/718 |
| 2007/0000655 A1 * | 1/2007 | Uchida et al. | 165/170 |
| 2009/0108429 A1 * | 4/2009 | Tsao et al. | 257/686 |

FOREIGN PATENT DOCUMENTS

| | | |
|---|---|---|
| WO | WO 2010/096355 A2 | 8/2010 |
| WO | 2011017385 | 2/2011 |
| WO | 2011038184 | 3/2011 |
| WO | 2011044445 | 4/2011 |

* cited by examiner

*Primary Examiner* — Nitin Parekh
(74) *Attorney, Agent, or Firm* — Pierce Atwood LLP; Joseph M. Maraia (57) ABSTRACT

In some embodiments, a semiconductor cooling apparatus includes a monolithic array of cooling elements. Each cooling element of the monolithic array of cooling elements is configured to thermally couple to a respective semiconductor element of an array of semiconductor elements. At least two of the semiconductor elements have a different height and each cooling element independently flexes to conform to the height of the respective semiconductor element.

15 Claims, 10 Drawing Sheets

SEMICONDUCTOR COOLING APPARATUS

GOVERNMENT SUPPORT

This disclosure was made with government support under FA8650-04-G-0002 awarded by the Department of Defense. The government has certain rights in this disclosure.

BACKGROUND

A flat aluminum brazed monolithic cooling apparatus can be used with highly conformal low thermal performance heat spreaders, such as a gap pad or gap filler material, to accommodate vertical height variations in semiconductors and individual variations in planarity with respect to the cooling apparatus surface. After the individual semiconductors are attached to an array, the semiconductor height variations can be mapped for the entire array in order to select custom heat spreaders for each semiconductor element. This solution, generally, is effective for planar arrays, but, generally, this solution is not effective for semiconductor arrays with various vertical height variations due to the inefficiency of the heat spreaders and the difficulties of accurately mapping and fitting the custom heat spreaders.

Thus, a need exists in the art for a semiconductor cooling apparatus with the features as described herein.

SUMMARY

One approach to a semiconductor cooling apparatus includes a monolithic array of cooling elements. Each cooling element is configured to thermally couple to a respective semiconductor element of an array of semiconductor elements. At least two of the semiconductor elements have a different height and each cooling element independently flexes to conform to the height of the respective semiconductor element.

Another approach to a semiconductor cooling apparatus includes a means for cooling semiconductor elements and a means for flexibly conforming each means for cooling to a respective height of a respective semiconductor element. The means for cooling is arranged in a monolithic array. Each means for cooling is thermally coupled to a respective semiconductor element of an array of semiconductor elements. At least two of the semiconductor elements have a different height.

Any of the approaches described herein can include one or more of the following examples.

In some examples, each cooling element further includes a coolant supply manifold and a coolant return manifold. The coolant supply manifold is flexibly coupled to a coolant supply line. The coolant return manifold is flexibly coupled to a coolant return line.

In other examples, the coolant supply manifold and the coolant return manifold are substantially wrap-around a part of the respective cooling element.

In some examples, the coolant supply manifold and the coolant return manifold flex independent of the monolithic array of cooling elements.

In other examples, each cooling element is formable through a bonding process to form a monolithic structure.

In some examples, the bonding includes diffusion bonding, adhesive bonding, and/or brazing.

In other examples, each cooling element is bonded together to form the monolithic array.

In some examples, the semiconductor cooling apparatus further includes a coolant chilling apparatus and a coolant pump. The coolant chilling apparatus is connected to the coolant supply line and the coolant return line and configured to chill coolant. The coolant pump is configured to pump the coolant between the coolant chilling apparatus and the array of cooling elements.

In other examples, the coolant comprising a liquid coolant, and/or a gaseous coolant.

In some examples, the coolant is supplied to each cooling element in parallel.

In other examples, the flexing of each cooling element reduces a thermal resistance interface between the cooling element and the respective semiconductor element.

In some examples, the semiconductor cooling apparatus further includes a plurality of spring clips. Each spring clip is configured to couple the respective cooling element in the array of cooling elements to its respective semiconductor element.

In other examples, the semiconductor cooling apparatus includes aluminum, copper, and/or stainless steel.

In some examples, the semiconductor cooling apparatus further includes a means for coupling the means for cooling to the respective semiconductor element.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

Semiconductor elements, such as a ball grid array (BGA), can be used as part of aerospace sensor architectures and/or other semiconductor architectures. In most instances, each of the semiconductor elements is soldered to a primary circuit board (e.g., motherboard, array, etc.) creating the semiconductor array. Due to the size, spacing, and thermal properties of the semiconductor elements on the array, a semiconductor cooling apparatus is needed to quickly and efficiently transfer heat from the array. However, each element in the semiconductor array can have different stack-ups (also referred to as vertical heights of the elements) making it difficult to effectively transfer heat from each stack. Thus, the semiconductor cooling apparatus, as described herein, includes a monolithic array of cooling elements, where each cooling element can be configured to thermally couple to a respective semiconductor element (stack-up) of an array of semiconductor elements. Advantageously, each cooling element can independently flex to conform to the height of the respective semiconductor element (e.g., a math coprocessor is 0.02 inches high and a video processor is 0.04 inches high, an input/output processor is 0.023 inches high and an encryption processor is 0.034 inches high, etc.), thereby increasing the thermal transfer between the semiconductor element and the cooling element.

As a general overview of the semiconductor cooling apparatus, the semiconductor cooling apparatus (e.g., a conformal foil cold wall, a monolithic flexible sheet, etc.) includes multiple cooling elements (e.g., coolers, cooling areas, etc.) sized so that there is one cooling element per semiconductor element (e.g., a BGA heat spreader, a processor, etc.). Coolant (e.g., liquid, air, etc.) flows into and out of the cooling element via flexible runners (e.g., one inlet and one outlet) that connect the cooling element to the main manifold channels. Each cooling element can, therefore, adapt to the vertical height and planarity variations of the semiconductor elements by way of the flexible runners.

The semiconductor cooling apparatus can be fabricated by diffusion bonding multiple foil layers providing a thin single piece or monolithic, flexible flat architecture. The semiconductor cooling apparatus can be made of copper and/or copper alloys, thereby improving thermal performance and allowing the semiconductor cooling apparatus to be deformed slightly at strategic points if needed to conform to 2D architectures.

Large arrays of semiconductor elements present a unique thermal design problem due to the large size of such arrays and large variations in the components utilized in such arrays. The semiconductor cooling apparatus as described herein can advantageously solve this thermal design problem by combining diffusion bonding fabrication that creates thin highly planar microchannel assemblies with flexible elements that integrate both structural and hydraulic functions. The architecture of the semiconductor cooling apparatus (e.g., copper foil, copper alloy, etc.) can be thin enough to be strategically deformed along the reinforced main manifolds (e.g., coolant supply manifold, coolant return manifold, etc.) in order to support faceted flat architectures consisting of 2 planar elements joined at a shallow angle—(i.e., enable each cooling element to flex independently for the respective semiconductor element).

Figure 1:
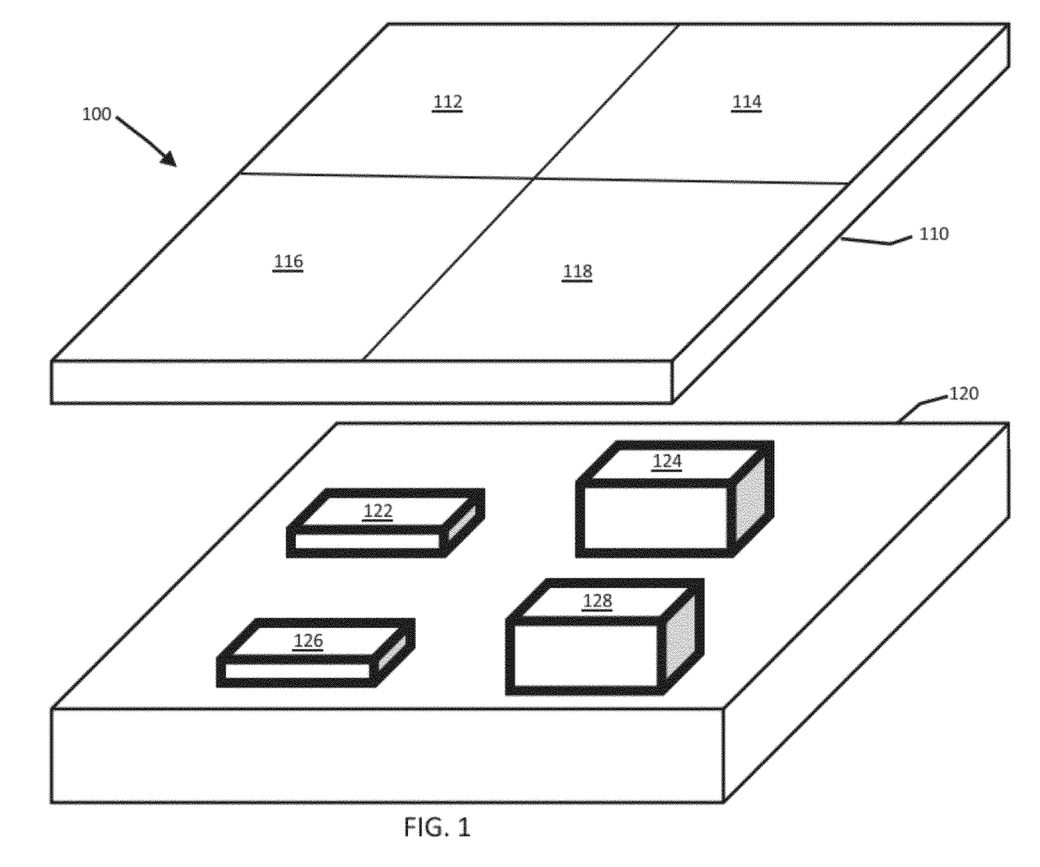
FIG. 1 is a block diagram of an exemplary semiconductor cooling apparatus and semiconductor array.

FIG. 1 is a block diagram 100 of an exemplary semiconductor cooling apparatus 110 and semiconductor array 120 (e.g., ball grid array (BGA), computer motherboard, etc.). The semiconductor cooling apparatus 110 includes a monolithic array of cooling elements 112, 114, 116, and 118 (e.g., a single formed sheet of cooling elements, a homogenous array of cooling elements, a heterogeneous array of cooling elements, etc.). The semiconductor array 120 includes semiconductor elements of various heights, widths, and lengths 122, 124, 126, and 128. Each cooling element 112, 114, 116, and 118 of the semiconductor cooling apparatus 110 is configured to thermally couple (e.g., positioned near each other to enable thermal transfer, positioned near each other to maximize thermal transfer, etc.) to the respective semiconductor element 122, 124, 126, and 128 of the array of semiconductor elements 120.

As illustrated in FIG. 1, at least two of the semiconductor elements 122, 124, 126, and 128 have a different height (e.g., with respect to the top of the semiconductor mounting surface, with respect to the bottom of the semiconductor cooling apparatus 110, with respect to each other, etc.). In operation, each cooling element 112, 114, 116, and 118 independently flexes to conform to the height of the respective semiconductor element 122, 124, 126, and 128, respectively (e.g., the cooling elements flex from 0.001 to 0.009 inches, the cooling elements flex from 0.01 to 0.09 inches, etc.). For example, the cooling element 112 flexes independently from the other cooling elements 114, 116, and 118 to conform to the height of the semiconductor element 122.

The independent flexibility of each cooling element advantageously increases the heat transfer between the semiconductor element and the cooling element, thereby extending the life of the semiconductor element by promoting proper cooling of the semiconductor element. The independent flexibility of each cooling element and/or the monolithic design of the semiconductor cooling apparatus advantageously reduces the installation time and cost by removing any needed individual customizations, thereby decreasing the overall cost of the devices associated with the semiconductor element while increasing the heat transfer.

In some examples, the flexible properties of each cooling element 112, 114, 116, and 118 reduces a thermal resistance interface between the cooling element 112, 114, 116, and 118 and the respective semiconductor element 122, 124, 126, and 128. For example, the cooling element 112 flexes 0.003 inches to be 0.001 inches from the respective semiconductor element 122, and the cooling element 114 flexes 0.002 inches to be 0.001 inches from the respective semiconductor element 124. The independent flexibility of each cooling element 112, 114, 116, and 118 advantageously enables the thermal resistance interface to be reduced (e.g., reduced thermal penalty from 20° C. to 10° C.; reduced thermal penalty from 8° C. to 3.2° C., etc.), thereby increasing the efficiency of the semiconductor cooling apparatus and increasing the life of the semiconductor elements.

In other examples, the semiconductor cooling apparatus can be produced using aluminum, copper, stainless steel, and/or material with high heat transfer (e.g., Glidcop available from SCM Metal Products, Inc., a copper alloy, etc.).

Figure 2:
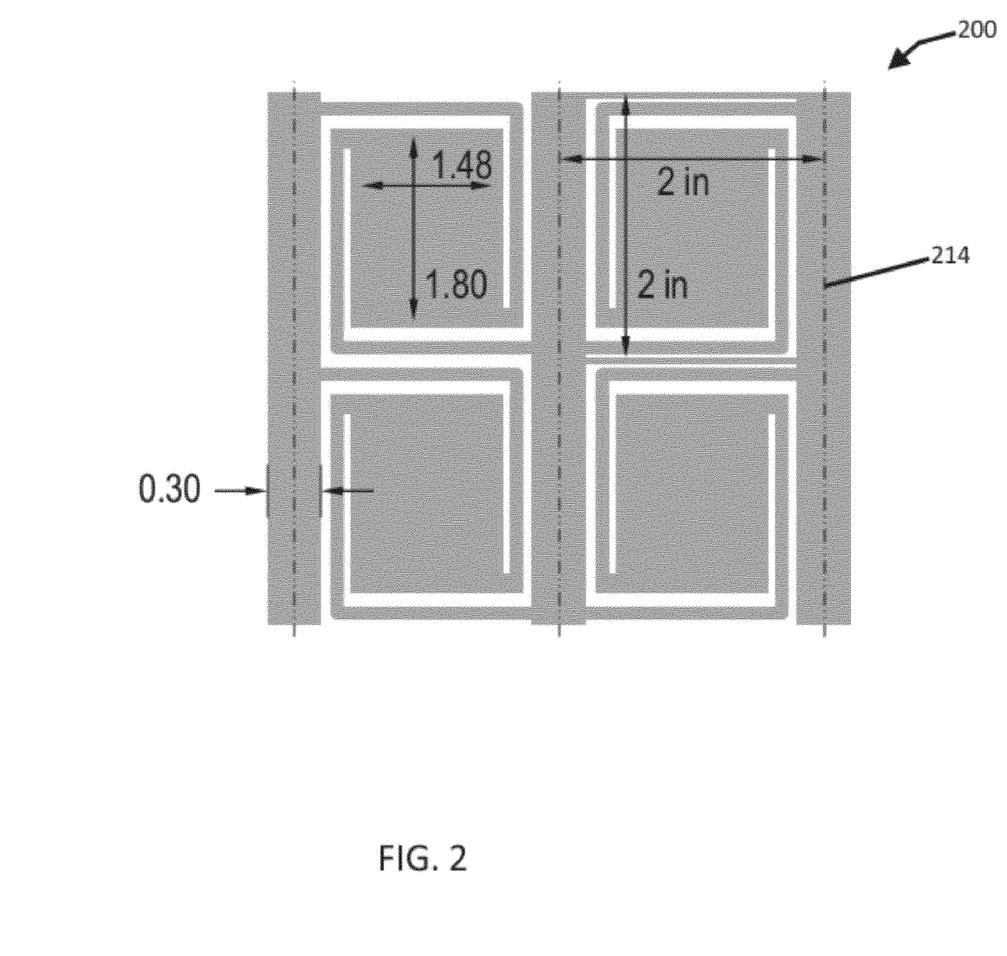
FIG. 2 is an illustration of another exemplary semiconductor cooling apparatus.

FIG. 2 is an illustration of another exemplary semiconductor cooling apparatus 200. The semiconductor cooling apparatus includes four cooling elements (e.g., cooling element 214). As illustrated in FIG. 2, each cooling element has outside dimensions of two inches by two inches and internal dimensions of 1.48 inches by 1.80 inches. The semiconductor cooling apparatus 200 illustrated in FIG. 2 can include top and bottom layers (not shown) to enclose the cooling elements (e.g., to prevent contamination of the semiconductor cooling apparatus 200 and/or parts therein, for ease of installation of the semiconductor cooling apparatus, etc.).

Although FIG. 2 illustrates four cooling elements in the semiconductor cooling apparatus 200, the semiconductor cooling apparatus 200 can include any number of cooling elements as needed to provide heat transfer of the semiconductor array (e.g., sixteen, twenty, forty, etc.). In other examples, the cooling elements in the semiconductor cooling apparatus 200 can be in one or more shapes and/or dimensions. For example, the semiconductor cooling apparatus includes four 2×2 inch cooling elements and eight 2×3 inch cooling elements. As another example, the semiconductor cooling apparatus includes four sets of four 3×3 inch cooling elements with two inch blank spaces between the sets of cooling elements.

Figure 3:
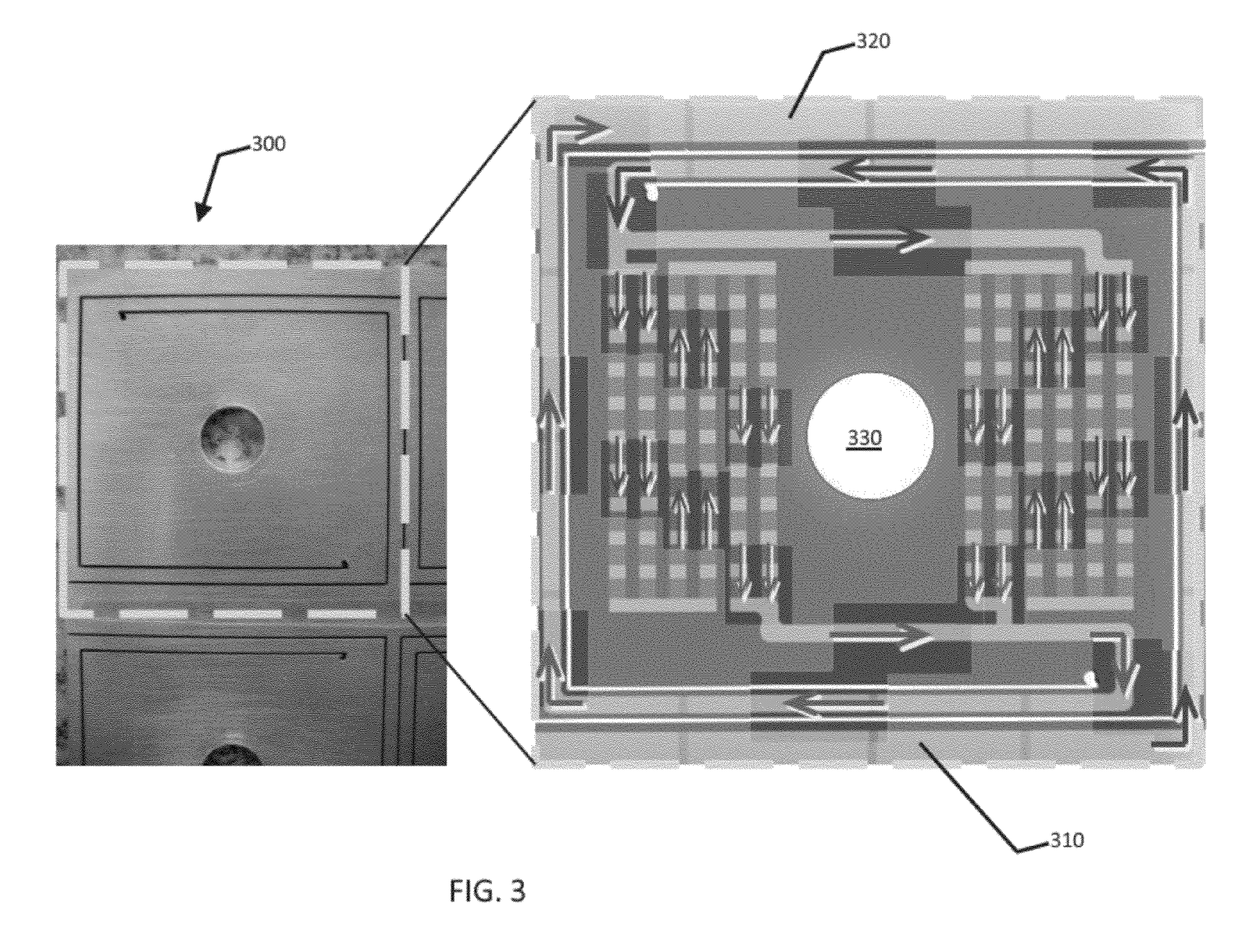
FIG. 3 is an illustration of internal parts of another exemplary cooling element.

FIG. 3 is an illustration of internal cavities (channels) of another exemplary cooling element 300. The cooling element 300 includes a coolant supply manifold 310, a coolant return manifold 320, and a mounting device 330. The coolant supply manifold 310 is flexibly coupled to a coolant supply line (not shown). The coolant return manifold 320 is flexibly coupled to a coolant return line (not shown). The mounting device 330 is utilized to mount the cooling element 300 on a semiconductor element (e.g., mounting hold for a spring clip, nut and bolt assembly, etc.).

As illustrated in FIG. 3, the coolant supply manifold 310 and the coolant return manifold 320 substantially wrap-around a part of the cooling element 300. The wrap-around of the manifolds 310 and 320 advantageously enables the cooling element 300 to individually flex (like a slinky) based on the height of the respective semiconductor element, thereby increasing the heat transfer between the cooling element and the semiconductor element, thereby extending the life of the semiconductor element.

Figure 4:
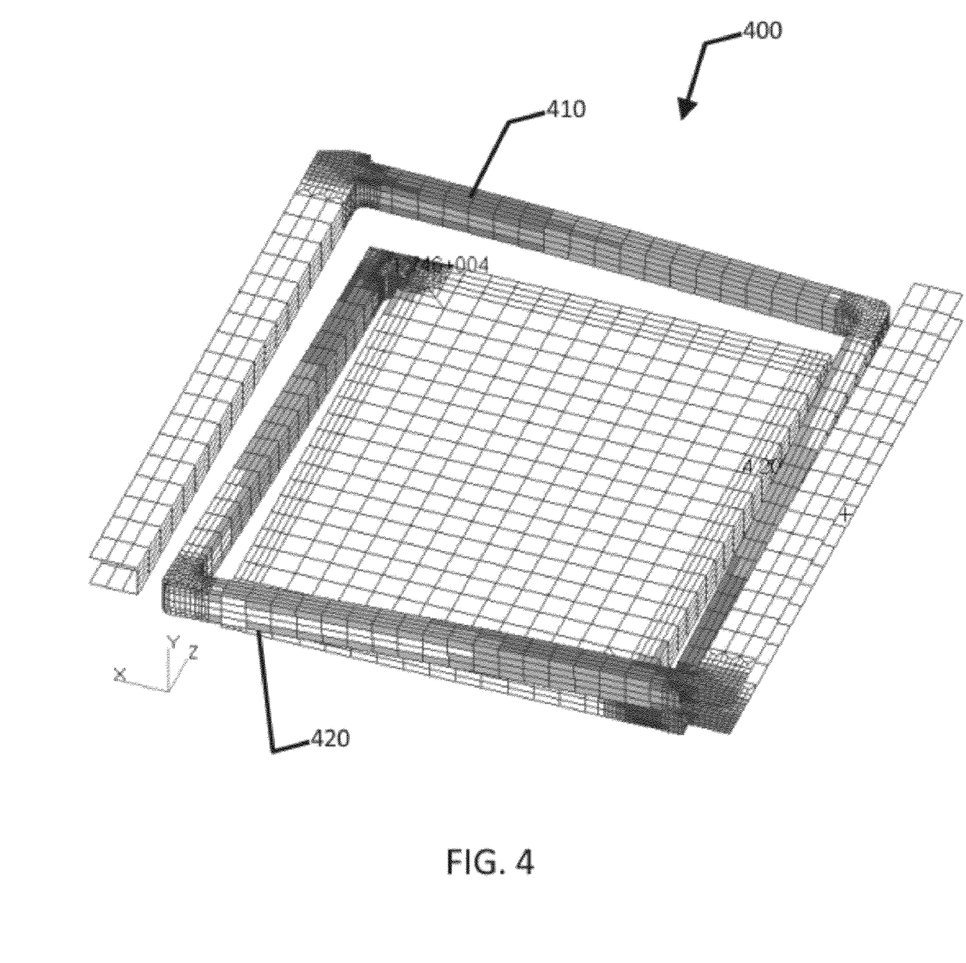
FIG. 4 is a view of another exemplary cooling element.

FIG. 4 is a view of another exemplary cooling element 400. The cooling element 400 includes a coolant supply manifold 410 and a coolant return manifold 420. The coolant supply manifold 410 and the coolant return manifold 420 flex independent of the monolithic array of cooling elements (e.g., semiconductor cooling apparatus 110 of FIG. 1). As illustrated in FIG. 4, the wrapping-around of the coolant supply manifold 410 and the coolant return manifold 420 advantageously enables the cooling element 400 to flex in 3-dimensions (i.e., the x, y, and z planes).

Figure 5A:
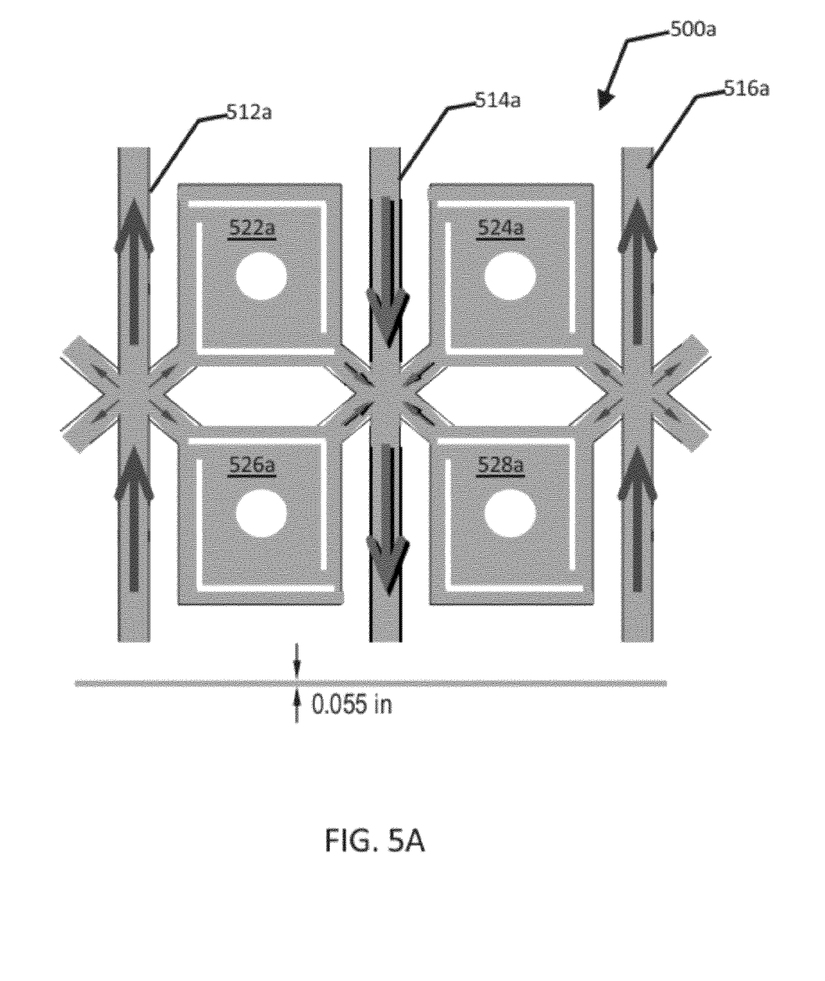
FIG. 5A is an illustration of another exemplary semiconductor cooling apparatus

FIG. 5A is an illustration of another exemplary semiconductor cooling apparatus 500a. The semiconductor cooling apparatus 500a includes coolant supply lines 512a and 516a, a coolant return line 514a, and cooling elements 522a, 524a, 526a, and 528a. The coolant supply line 512a supplies coolant to the cooling elements 522a and 526a from a coolant chilling apparatus (not shown). The coolant supply line 516a supplies coolant to the cooling elements 524a and 528a from the coolant chilling apparatus. The coolant return line 514a returns coolant from the cooling elements 522a, 524a, 526a, and 528a to the coolant chilling apparatus.

Figure 5B:
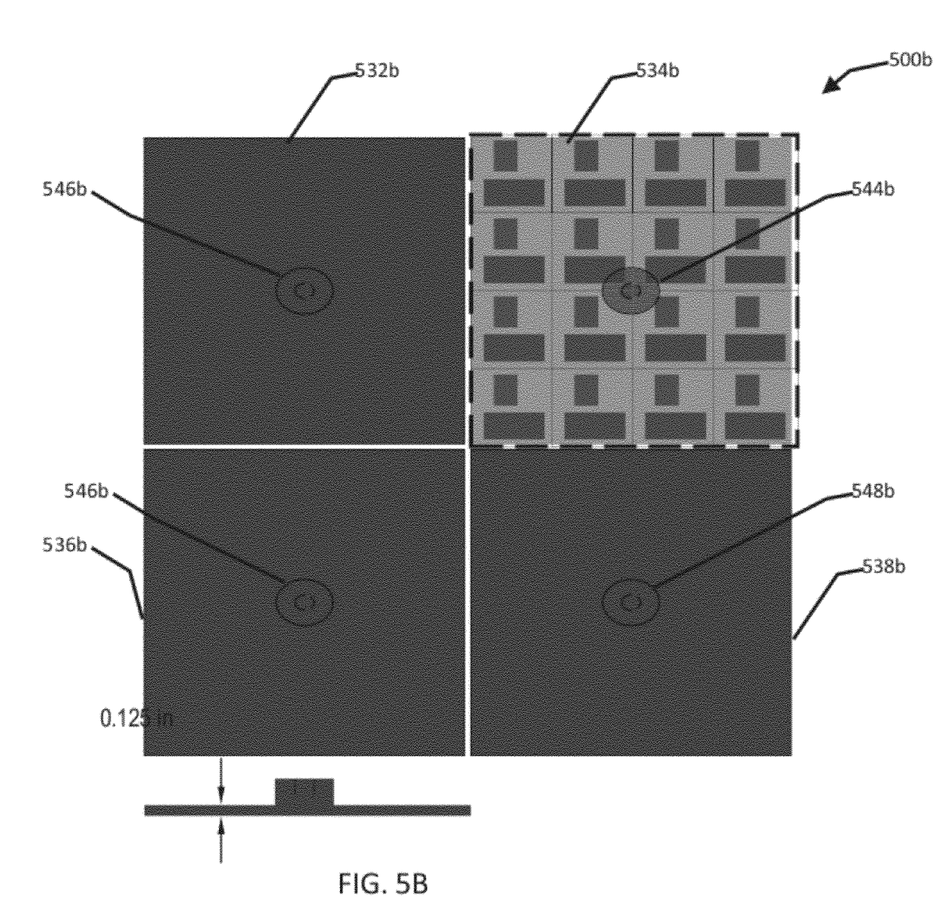
FIG. 5B is an illustration of an exemplary array of semiconductor elements.

FIG. 5B is an illustration of an exemplary array of semiconductor elements 500b. The array of semiconductor elements 500b includes semiconductor elements 532b, 534b, 536b, and 538b. As illustrated, each semiconductor element 532b, 534b, 536b, and 538b includes a mounting tab 542b, 544b, 546b, and 548b, respectively, for securing a cooling element to the semiconductor element (e.g., via a spring clip, via a nut, etc.).

Figure 5C:
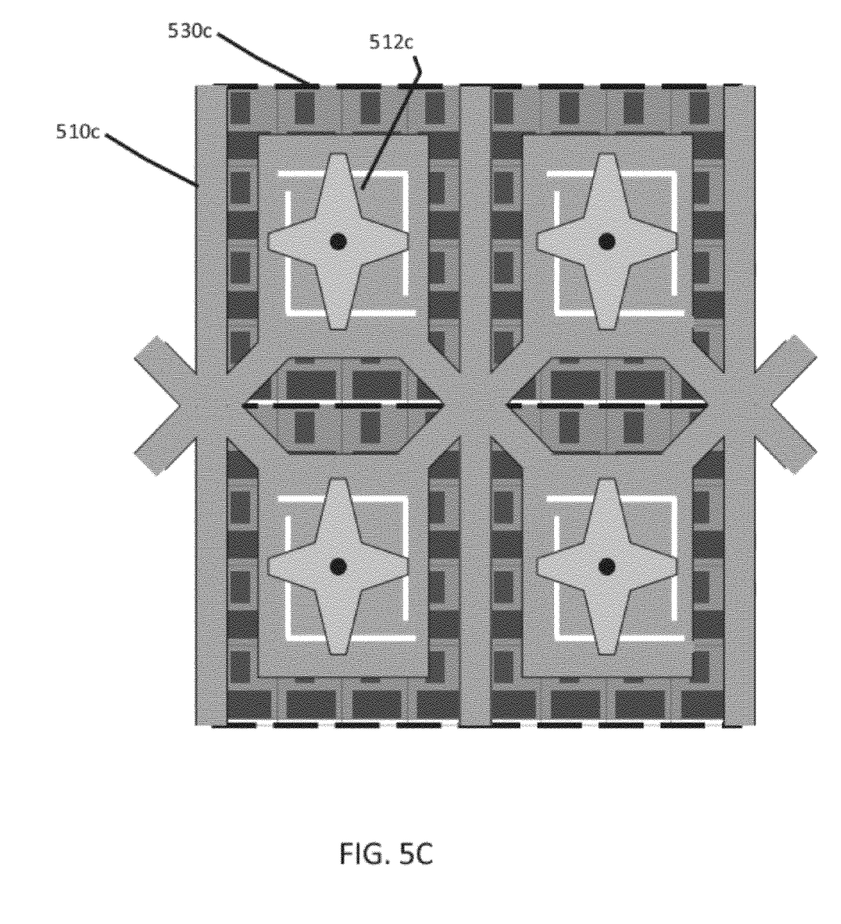
FIG. 5C is an illustration of another exemplary semiconductor cooling apparatus mounted on an exemplary array of semiconductor elements.

FIG. 5C is an illustration of another exemplary semiconductor cooling apparatus 510c mounted on an exemplary array of semiconductor elements 530c. A spring clip (e.g., 512c) on each cooling element attaches to the respective semiconductor element, thereby securing the semiconductor cooling apparatus and parts thereof (i.e., the cooling elements) to the array of semiconductor elements 530c and respective parts thereof (i.e., the semiconductor elements).

Figure 6:
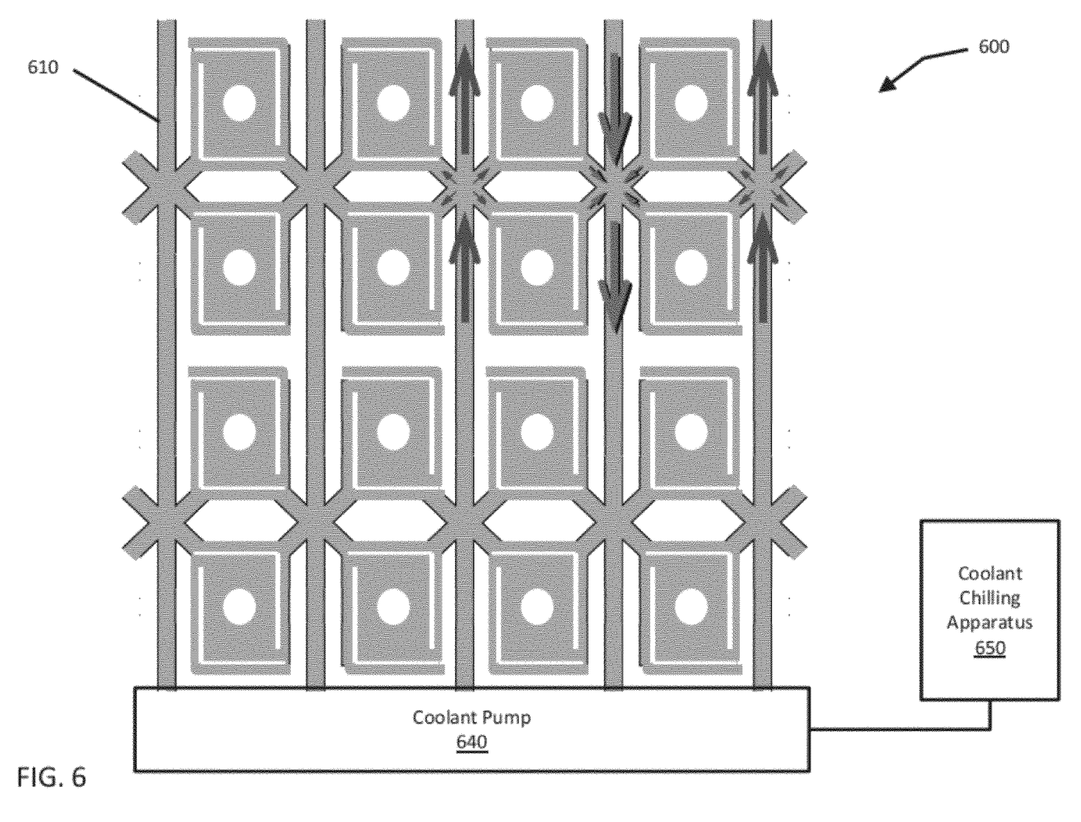
FIG. 6 is an illustration of another exemplary semiconductor cooling apparatus.

FIG. 6 is an illustration of another exemplary semiconductor cooling apparatus 600. The semiconductor cooling apparatus includes an array of cooling elements 610, a coolant chilling apparatus 650, and a coolant pump 660. The coolant chilling apparatus 650 is connected to one or more coolant supply lines and one or more coolant return lines and is configured to chill coolant. The coolant pump 660 is configured to pump the coolant between the coolant chilling apparatus 650 and the array of cooling elements 610.

In some examples, the coolant includes a liquid coolant (e.g., oil, water, etc.), a gaseous coolant and/or any other type of coolant.

In other examples, the coolant is supplied to each cooling element in parallel. As illustrated in FIG. 6, the one or more coolant supply lines supply the chilled coolant to the array of cooling elements 610 in parallel, thereby advantageously enabling the chilled coolant to be provided to each cooling element while chilled and extending the life of the cooling elements.

Figure 7:
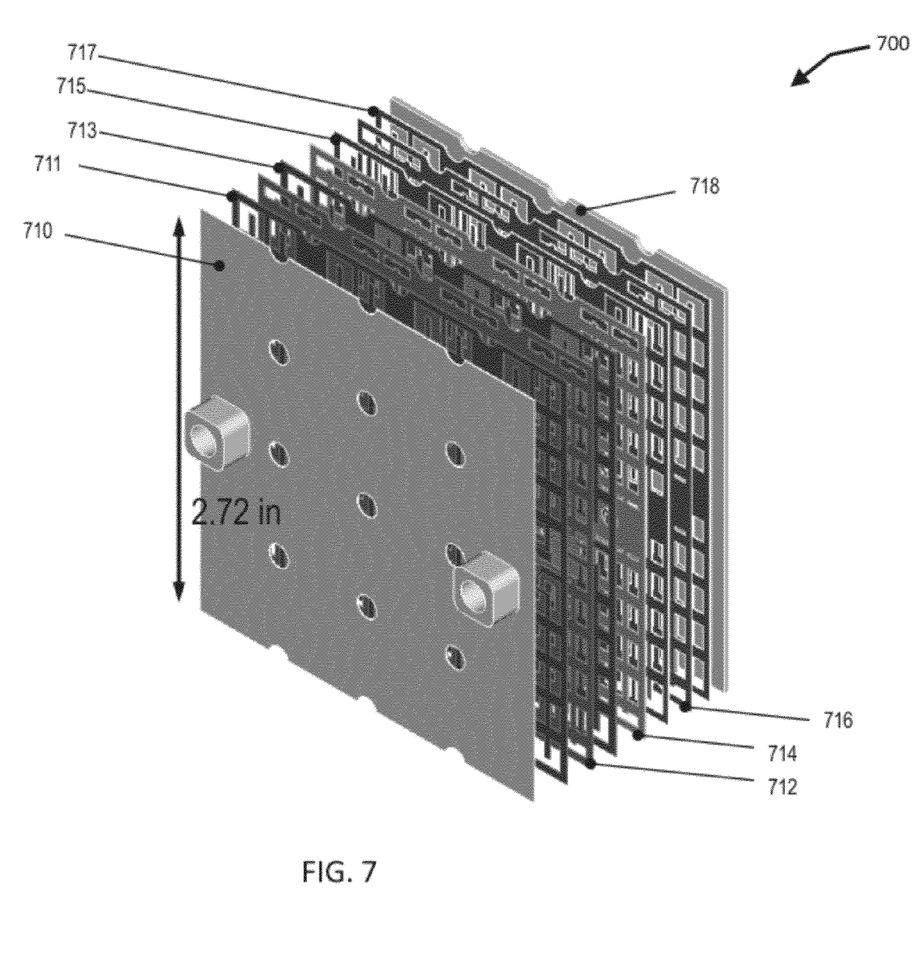
FIG. 7 is an exploded view of layers of an exemplary unassembled semiconductor cooling apparatus.

FIG. 7 is an exploded view of layers of an exemplary unassembled semiconductor cooling apparatus 700. The unassembled semiconductor cooling apparatus 700 includes a plurality of layers including cap layers 710 and 718 and internal layers 711, 712, 713, 714, 715, 716, and 717.

Although FIG. 7 illustrates the unassembled semiconductor cooling apparatus 700 having two cap layers and seven internal layers, the unassembled semiconductor cooling apparatus can include any number of layers (e.g., two cap layers and one internal layer, four cap layers and ten internal layers, etc.).

In some examples, each cooling element is formable through a bonding process to form a monolithic structure. In other examples, the bonding includes diffusion bonding, adhesive bonding, brazing, and/or any other type of bonding mechanism. In some examples, each cooling element is bonded together to form the monolithic array.

Figure 8:
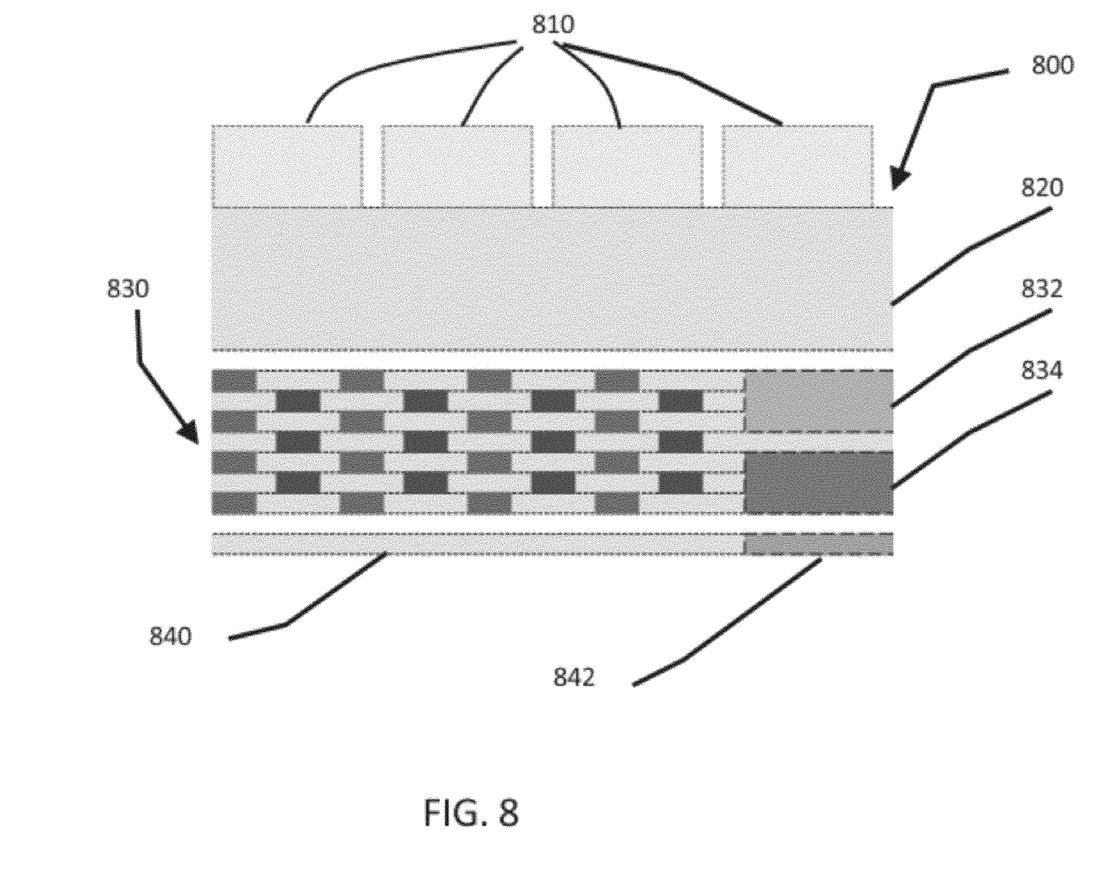
FIG. 8 is a cross sectional view of another exemplary semiconductor cooling apparatus.

FIG. 8 is a cross sectional view of another exemplary semiconductor cooling apparatus 800 and an array of semiconductor elements 810. The semiconductor cooling apparatus 800 includes a facesheet 820 (i.e., a cap layer), a plurality of coolant channels 830b, a coolant supply channel 832b, a coolant return channel 834b, a cap foil 840b (i.e., a cap layer), and an inlet/outlet port 842b in the cap foil 840b for the coolant supply channel 832b and the coolant return channel 824b.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A semiconductor cooling apparatus, comprising: a monolithic array of cooling elements, each cooling element configured to thermally couple to a respective semiconductor element of an array of semiconductor elements; and wherein at least two of the semiconductor elements have a different height and each cooling element independently flexes to conform to the height of the respective semiconductor element.

2. The semiconductor cooling apparatus of claim 1, each cooling element further comprising: a coolant supply manifold flexibly coupled to a coolant supply line; and a coolant return manifold flexibly coupled to a coolant return line.

3. The semiconductor cooling apparatus of claim 2, wherein the coolant supply manifold and the coolant return manifold substantially wrap-around a part of the respective cooling element.

4. The semiconductor cooling apparatus of claim 2, wherein the coolant supply manifold and the coolant return manifold flex independent of the monolithic array of cooling elements.

5. The semiconductor cooling apparatus of claim 2, wherein each cooling element formable through a bonding process to form a monolithic structure.

6. The semiconductor cooling apparatus of claim 5, wherein the bonding comprising diffusion bonding, adhesive bonding, brazing, or any combination thereof.

7. The semiconductor cooling apparatus of claim 4, wherein each cooling element is bonded together to form the monolithic array.

8. The semiconductor cooling apparatus of claim 2, further comprising: a coolant chilling apparatus connected to the coolant supply line and the coolant return line and configured to chill coolant; and a coolant pump configured to pump the coolant between the coolant chilling apparatus and the array of cooling elements.

9. The semiconductor cooling apparatus of claim 8, wherein the coolant comprising a liquid coolant, a gaseous coolant, or any combination thereof.

10. The semiconductor cooling apparatus of claim 8, wherein the coolant is supplied to each cooling element in parallel.

11. The semiconductor cooling apparatus of claim 1, wherein the flexing of each cooling element reduces a thermal resistance interface between the cooling element and the respective semiconductor element.

12. The semiconductor cooling apparatus of claim 1, further comprising a plurality of spring clips, each spring clip configured to couple the respective cooling element in the array of cooling elements to its respective semiconductor element.

13. The semiconductor cooling apparatus of claim 1, wherein the semiconductor cooling apparatus comprising aluminum, copper, stainless steel, or any combination thereof.

14. A semiconductor cooling apparatus comprising: means for cooling semiconductor elements, the means for cooling arranged in a monolithic array, each means for cooling is thermally coupled to a respective semiconductor element of an array of semiconductor elements; and means for flexibly conforming each means for cooling to a respective height of a respective semiconductor element, wherein at least two of the semiconductor elements have a different height.

15. The semiconductor cooling apparatus of claim 14, further comprising means for coupling the means for cooling to the respective semiconductor element.

* * * * *